United States Patent
Fahim

(10) Patent No.: US 7,365,607 B2
(45) Date of Patent: Apr. 29, 2008

(54) LOW-POWER, LOW-JITTER, FRACTIONAL-N ALL-DIGITAL PHASE-LOCKED LOOP (PLL)

(75) Inventor: Amr Fahim, Newport Beach, CA (US)

(73) Assignee: Newport Media, Inc., Lake Forest, CA (US)

( * ) Notice: Subject to any disclaimer, the term of this patent is extended or adjusted under 35 U.S.C. 154(b) by 77 days.

(21) Appl. No.: 11/463,630

(22) Filed: Aug. 10, 2006

(65) Prior Publication Data

US 2008/0048791 A1    Feb. 28, 2008

(51) Int. Cl.
*H03L 7/00* (2006.01)
(52) U.S. Cl. .................. 331/1 A; 331/17; 327/156; 375/376
(58) Field of Classification Search .......... 331/1 A, 331/16, 17, 18, 23, 25; 327/156, 159, 157; 332/127, 128; 375/373, 375, 376
See application file for complete search history.

(56) References Cited

U.S. PATENT DOCUMENTS 6,504,498 B1 * 1/2003 O'Brien ................ 341/143
6,784,755 B2 * 8/2004 Lin et al. ................ 331/57
7,282,999 B2 * 10/2007 Da Dalt et al. ........... 331/1 A
2005/0206458 A1 * 9/2005 Wu ........................ 331/1 A
2006/0017512 A1 * 1/2006 Huang ..................... 331/17

* cited by examiner

*Primary Examiner*—Robert J. Pascal
*Assistant Examiner*—Ryan J Johnson
(74) *Attorney, Agent, or Firm*—Mohammad S. Rahman, Esq.; Gibb & Rahman, LLC

(57) ABSTRACT

A method for synthesizing frequencies with a low-jitter an all-digital fractional-N phase-locked loop (PLL) electronic circuit adapted to synthesize frequencies with low-jitter, wherein the electronic circuit comprises a digital phase-frequency detector (DPFD) operatively connected to a digital loop filter (DLF), wherein the DPFD adapted to receive a reference signal and a feedback signal; compare a phase and frequency of the reference and feedback signals to determine a phase and frequency error between the reference and feedback signals; and provide a DPFD output comprising a multi-bit output; wherein the DLF is adapted to receive and filter the DPFD output and provide a DLF output, and wherein the DLF output is updated at each reference period.

19 Claims, 12 Drawing Sheets

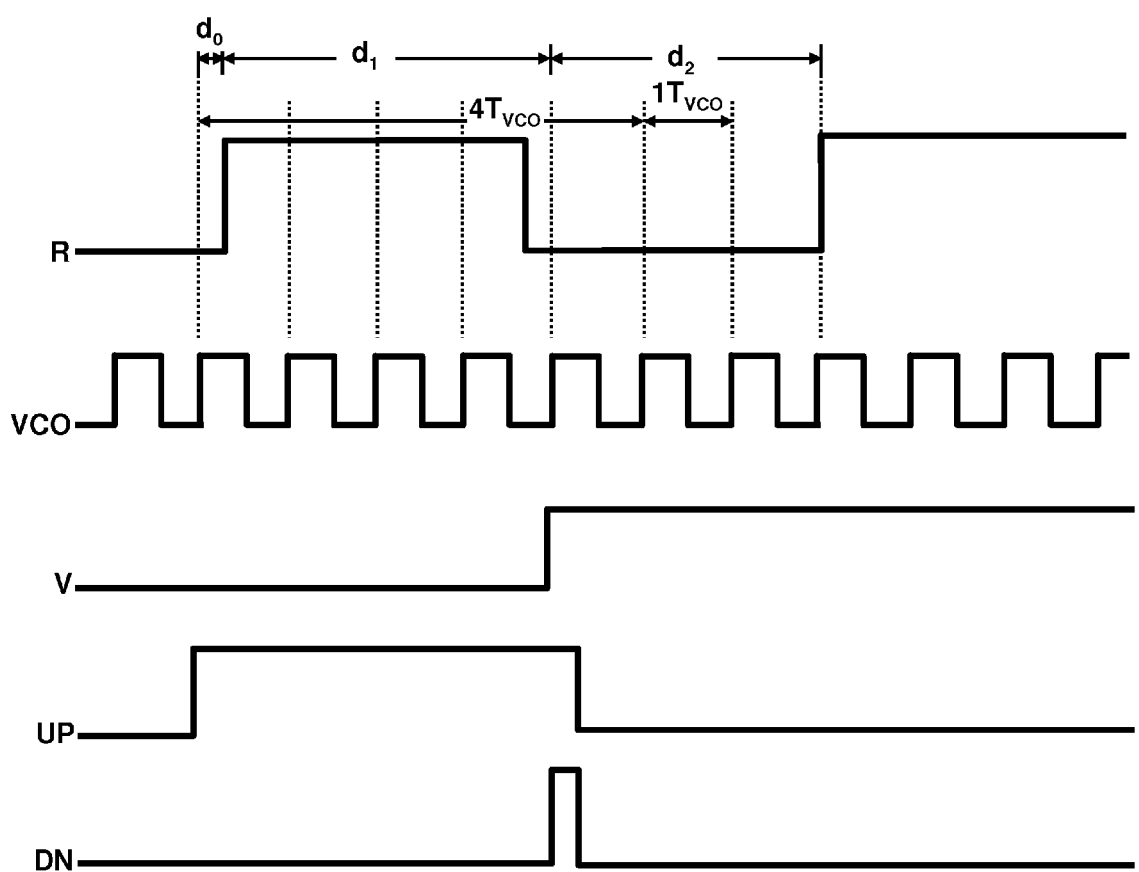

LOW-POWER, LOW-JITTER, FRACTIONAL-N ALL-DIGITAL PHASE-LOCKED LOOP (PLL)

BACKGROUND

1. Technical Field

The embodiments herein generally relate to electronics circuits, and, more particularly, to a digital phase-locked loop (PLL) electronic circuit.

2. Description of the Related Art

Phase-locked loops (PLLs) are an integral part of many electronic circuits and are particularly important in communication circuits. For example, digital systems use clock signals to trigger synchronous circuits (e.g., flip-flops). Transmitter and receiver systems use local oscillator (LO) signals for frequency up-conversion and down-conversion, respectively. A wireless device (e.g., cellular phones) in wireless communication systems typically uses clock signals for digital circuitry and LO signals for transmitter and receiver circuitry. Clock and LO signals are often generated with phase-locked loops.

FIG. 1(A) shows a conventional integer PLL 100, which generally consists of a crystal oscillator 114, a phase frequency detector (PFD) 111, a loop filter (LF) 120, a voltage controlled oscillator (VCO) 112, and a divider 113. VCO 112 generates an oscillator signal having a frequency determined by a control signal from LF 120. Divider 113 divides the oscillator signal input frequency by a factor of N, whereby N is an integer, and provides a feedback signal. PFD 111 receives a reference signal and the feedback signal, compares the phases of the two signals, and provides a detector signal that is proportional to the detected phase difference or error between the two signals. LF 120 filters the detector signal and provides the control signal for VCO 112. Moreover, LF 120 adjusts the control signal such that the phase of the feedback signal is locked to that of the reference signal.

Generally, one of the main limitations of a conventional PLL 100 is that the output frequency is limited to be an integer multiple of the input frequency. This can be quite problematic for system-on-chip (SOC) and software defined radios (SDRs) where multiple standards and multiple applications are integrated on one chip. If an integer PLL 100 is used, then multiple external crystal oscillators 114 must typically be used, which tends to increase the board area, cost, and generally limits the ability to integrate higher level functions on one board. For this reason, a fractional-N PLL 150 is often used, as shown in FIG. 1(B).

The fractional-N PLL 150 periodically switches between two adjacent division ratios, N and N+1, in such a way that the average division ratio, N.F, is the desired division ratio. This is accomplished by a dual modulus frequency divider 152. The instantaneous frequency division value of the dual modulus divider 152 is controlled by the carry out signal of an accumulator 151. The input to the accumulator 151 is the digital representation of the desired fractional division ratio, F. The averaging is performed by the closed loop PLL low-pass filter response. Using this method, frequency steps less than the input crystal oscillator frequency can be obtained. Since fractional-N PLLs generally achieve an average division ratio N.F by periodically switching between N and N+1, the PLL output spectrum tends to contain undesired tonal signals at exactly the desired fractional values and their harmonics. Typically, these tonal signals can only be attenuated by the closed loop low-pass filter response of the PLL 150. For very small fractional values, the cut-off frequency of the low-pass filter may be very narrow, necessitating an off-chip loop filter.

Another alternative is to select the choice of N and N+1 by a digital sigma-delta modulator 202 as shown in FIG. 2. The PLL 200 in FIG. 2 is known as a sigma-delta PLL 200. The advantage of a sigma-delta PLL 200 is that it converts low-frequency tones into high-frequency quantization noise, as shown in FIG. 3. This enables a substantial reduction in the size of the LF 120, enabling the LF 120 to be integrated on-chip. The function of the LF 120 then becomes to filter out the high-pass filtered quantization noise instead of low-frequency in-band tones.

The sigma-delta PLL 200 is similar to a conventional fractional-N PLL 150, but differs in some respects. The dual modulus divider 152 and accumulator 151 are substituted with a multimodulus divider 201 and a digital sigma delta modulator 202, as shown in FIG. 2. The main disadvantage of a conventional fractional-N PLL 150 is that the choice of N and N+1 division ratios is chosen in a periodic fashion. This periodic behavior results in tonal output response which heavily degrades the output spectrum of the PLL 150. A sigma-delta PLL 200 uses a digital sigma-delta modulator 202 to randomize the choice between N and N+1. Indeed, a sigma-delta modulator 202 can be of higher order than 1, meaning the output of the sigma-delta modulator 202 can be greater than 1 bit. This means that a dual-modulus divider is insufficient and a multimodulus divider 201 is necessary to dither (modulate) the choice of frequency division value from N−b1 to N+b2, where −b1 is the minimum level produced by the digital sigma-delta modulator 202 and +b2 is the maximum level produced by the digital sigma-delta modulator 202.

Although effective compared to a fractional-N PLL 150, a sigma-delta PLL 200 still generally suffers from several shortcomings. First, the sigma-delta quantization noise is typically still too high. To sufficiently attenuate high-frequency quantization noise, the loop filter corner frequency must generally be brought sufficiently low. This may result in a PLL implementation where the area is dominated by large LF capacitors. Reducing the closed loop bandwidth also typically means that less VCO phase noise is suppressed. This is less problematic if a high-Q resonance inductance-capacitance (LC) tank is used to implement the VCO 112. However, in most clock generator applications, a compact ring oscillator-based VCO is used, which has a notoriously high-phase noise. In these types of applications, the minimum total integrated phase noise, or jitter, produced by the PLL 200 is generally limited by equally balancing the jitter due to the sigma-delta quantization noise and the jitter due to the VCO phase noise.

Second, the analog implementation of the PLL 200 typically necessitates high linearity in the PFD 111. Since any mismatch or non-linearity in the PFD 111 can result in unequal step sizes or non-uniform sampling of the output of the divider 113, this can result in degradation in the high-pass noise shaping function of the sigma-delta modulator 202, which may lead to excessive in-band phase noise, and hence degradation of the performance of the PLL 200.

Third, analog PLL design is generally prone to various disadvantages. In an analog PLL, the LF 120 is generally implemented with analog circuit components (e.g., capacitors and resistors). One disadvantage of an analog implementation of a PLL 100, 150, 200 is large die area for the LF capacitors (which can occupy as much as 50% of the total area of the PLL 100, 150, 200). A second disadvantage is significant noise coupling through the substrate for a SOC design can seriously degrade the performance of the PLL 100, 150, 200. A third disadvantage is large undesired reference tones in the oscillator signal can develop due to gate leakage in the LF capacitors. Gate leakage generally increases exponentially with the reduction in oxide thickness and is thus more problematic as integrated circuit (IC) technology scales smaller.

A digital PLL avoids the disadvantages described above for the analog PLL. However, a major challenge for a digital fractional-N PLL design is obtaining a wide closed loop bandwidth while minimizing the spurious fractional-N tones or sigma-delta quantization noise. Wide loop bandwidth is generally desired for better tracking of the reference signal, which then reduces the amount of phase noise generated by the VCO and results in lower jitter. Jitter is the deviation from the average or expected cycle of the reference signal. In one conventional method, sigma-delta quantization noise is attenuated by subtracting an error term from the loop filter. However, this method is generally performed in the analog domain and may severely limit the achievable performance and generally impractically increases the die area. Therefore, there is a need in the art for a fractional-N digital PLL with improved performance and reduced jitter characteristics.

SUMMARY

In view of the foregoing, an embodiment herein provides a method for synthesizing frequencies with low-jitter using an all-digital fractional-N PLL electronic circuit comprising a digital phase-frequency detector (DPFD) and a digital loop filer (DLF), wherein the method comprises receiving a reference signal and a feedback signal; comparing a phase and frequency of the reference and feedback signals to determine a phase and frequency error between the reference and feedback signals; generating a DPFD output comprising a multi-bit output; filtering the DPFD output; and generating a DLF output, wherein the DLF output is updated at each reference period. The method further comprises generating an oscillator signal having a frequency determined by the DLF output; dividing the oscillator signal in frequency by a factor of N, whereby N comprises any of an integer and fractional value and is one or greater; and providing the feedback signal. Additionally, the method may further comprises providing a fine phase error; and counting coarse phase errors in steps of VCO periods or multiples thereof. Also, the method may further comprise counting the coarse phase errors as a fraction of the reference period; and updating the DLF every reference period. Additionally, the method further comprises canceling out mismatches in rise and fall times associated with the coarse phase errors. Moreover, the method further comprises estimating a voltage gain of a time-to-digital converter (TDC) used to provide the fine phase error; and correcting the voltage gain by digitally scaling an output word of the TDC. Furthermore, the method may further comprise producing a quantized output to a frequency divider used to receive the oscillator signal; and producing a digital correction term to an output of the DPFD. Additionally, the method may further comprise converting the DLF output into an analog waveform.

Another embodiment provides an all-digital fractional-N PLL electronic circuit adapted to synthesize frequencies with low-jitter, wherein the electronic circuit comprises a DPFD operatively connected to a DLF, wherein the DPFD adapted to receive a reference signal and a feedback signal; compare a phase and frequency of the reference and feedback signals to determine a phase and frequency error between the reference and feedback signals; and provide a DPFD output comprising a multi-bit output; wherein the DLF is adapted to receive and filter the DPFD output and provide a DLF output, and wherein the DLF output is updated at each reference period.

The electronic circuit may further comprise a VCO adapted to receive the DLF output and provide an oscillator signal having a frequency determined by the DLF output; and a frequency divider adapted to receive the oscillator signal; divide the oscillator signal in frequency by a factor of N, whereby N comprises any of an integer and fractional value and is one or greater; and provide the feedback signal. The DPFD may comprise a TDC adapted to provide fine phase error; dual registers adapted to hold fine phase error terms; and a set of accumulators adapted to count coarse phase errors in steps of VCO periods or multiples thereof. The electronic circuit may further comprise a software module operatively connected to the set of accumulators and adapted to count the coarse phase errors as a fraction of the reference period and update the DLF every reference period.

The TDC preferably comprises a set of two delay chains adapted to cancel out mismatches in rise and fall times in each delay chain. The electronic circuit may further comprise a calibration block operatively connected to the DPFD and adapted to estimate a voltage gain of the TDC and correct the voltage gain by digitally scaling an output word of the TDC. Moreover, the electronic circuit may further comprise a digital modulator adapted to produce a quantized output to the frequency divider and a digital correction term to an output of the DPFD. The digital modulator may comprise any of an accumulator, an mth order sigma-delta modulator for any integer m greater than one, and a network of sigma-delta modulators. Furthermore, the digital modulator may comprise a first sigma-delta modulator and a second sigma-delta modulator arranged to cancel out a quantization noise of the first sigma-delta modulator while scaling down a quantization noise of the second sigma-delta modulator. Preferably, an output of the digital modulator comprises the feedback signal plus the scaled down quantization noise of the second sigma-delta modulator.

Another embodiment provides an all-digital fractional-N PLL electronic circuit adapted to synthesize frequencies with low-jitter, wherein the electronic circuit comprises a DPFD adapted to receive a reference signal and a feedback signal; compare a phase and frequency of the reference and feedback signals to determine a phase and frequency error between the reference and feedback signals; and provide a DPFD output comprising a multi-bit output; a DLF operatively connected to the DPFD and adapted to receive and filter the DPFD output and provide a DLF output, wherein the DLF output is updated at each reference period; and a digital-to-analog converter (DAC) operatively connected to the DLF and adapted to receive and convert the DLF output to an analog waveform, wherein the analog waveform comprises any of an analog voltage waveform and an analog current waveform, wherein the DAC comprises A most significant bits (MSBs) of data and B least significant bits (LSBs) of data, and wherein the DAC is adapted to provide an A+B bit conversion to the analog waveform.

The A MSBs comprise bipolar outputs comprising any of on and off outputs, and the B MSBs are current-switched. Preferably, the B MSBs are current-switched by adding any of voltage to a total output analog voltage signal and current to a total output analog current signal. Moreover, the B MSBs are current-switched by adding voltage to a supply rail voltage. The electronic circuit may further comprise means for offsetting elements being toggled in an A+B bit DAC by factoring a B-bit word by two and enabling a half-MSB-sized element with an opposite polarity.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5(B) is a graphical representation illustrating an example of PFD operation;

DETAILED DESCRIPTION OF PREFERRED EMBODIMENTS

Figure 1A:
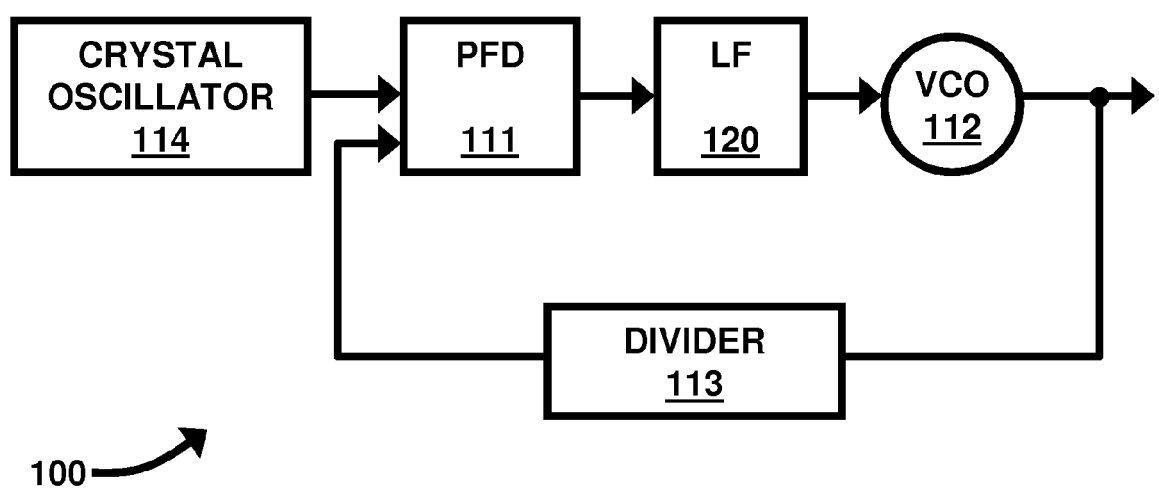
FIG. 1(A) is a system block diagram illustrating a conventional integer PLL electronic circuit.
Figure 1B:
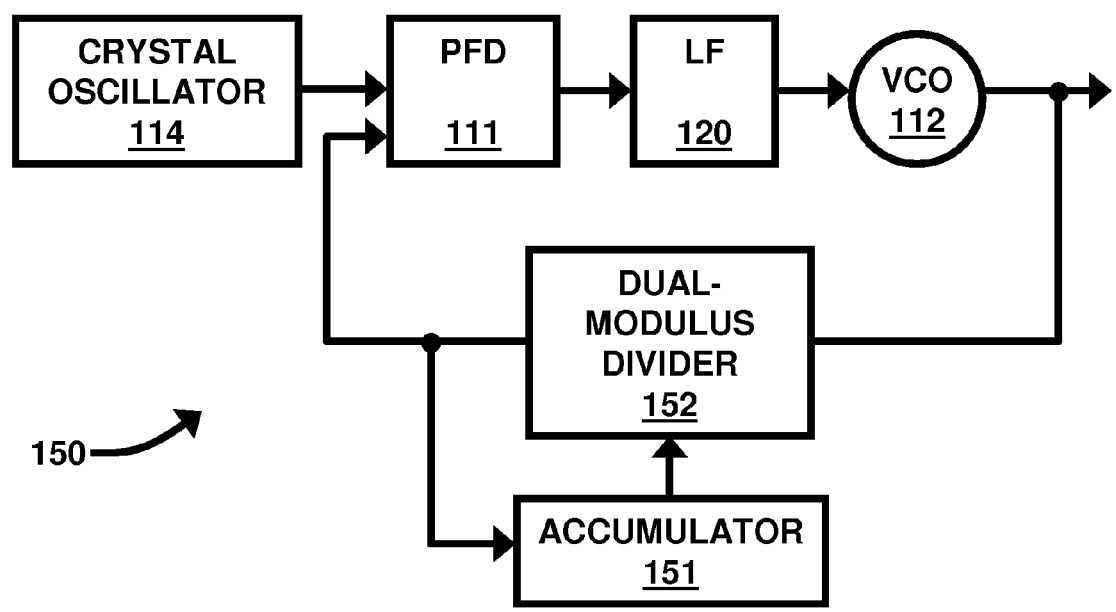
FIG. 1(B) is a system block diagram illustrating a conventional fractional-N PLL electronic circuit.
Figure 2:
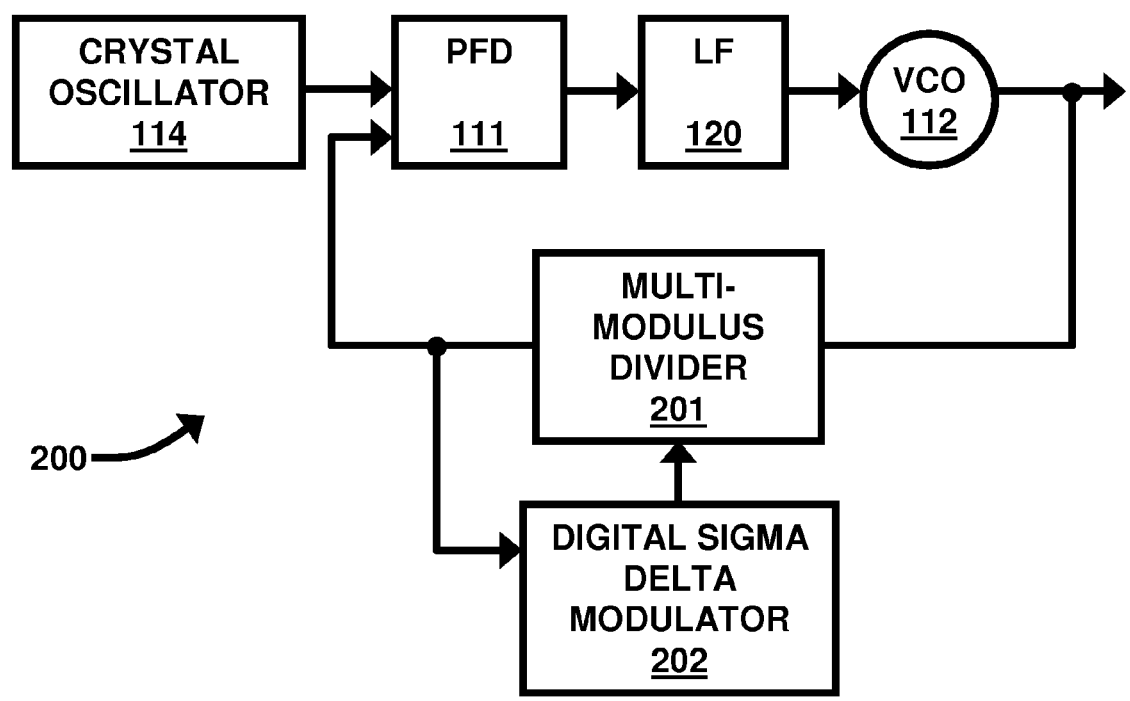
FIG. 2 is a system block diagram illustrating a conventional sigma-delta PLL electronic circuit.
Figure 3:
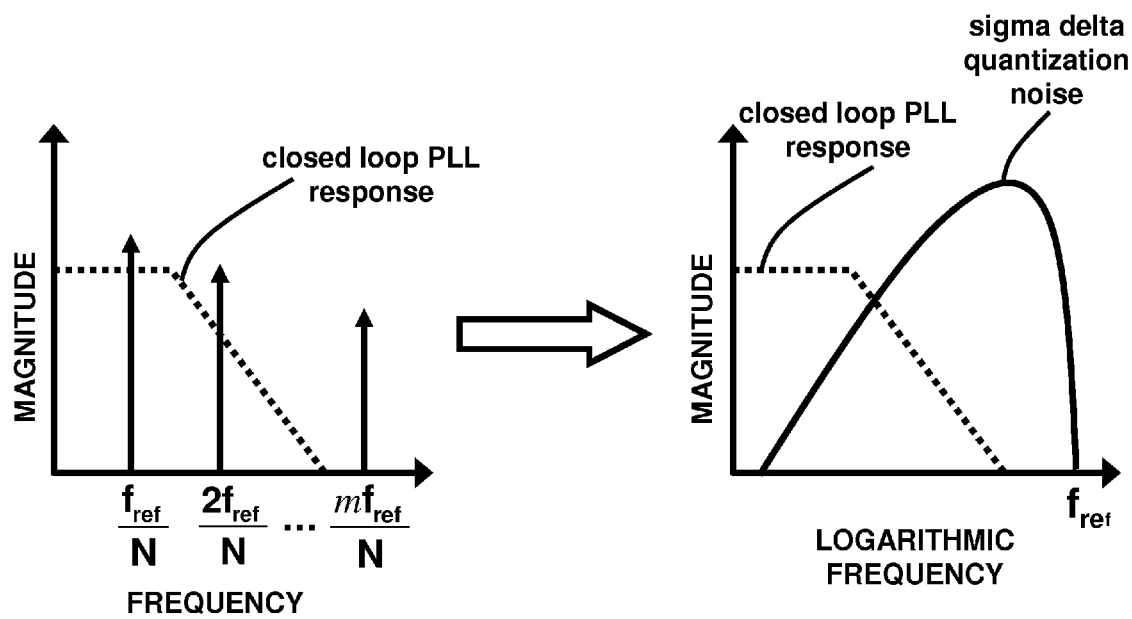
FIG. 3 is a graphical representation illustrating the conventional effect of sigma-delta modulation on fractional-N spurs.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As previously mentioned, there is a limitation to the minimum jitter achieved by a sigma-delta PLL which is dictated by balancing the jitter contribution of the sigma-delta quantization noise and the jitter contribution of the VCO phase noise. This minimum jitter is still quite high for many applications, which include, but are not limited to, a sampling clock for a data converter, a digital clock for high-speed digital circuitry, and front-end transceivers. For this reason, there is a need to develop a technique to minimize the quantization noise of sigma-delta modulators with minimal impact to area, power consumption, and performance. The embodiments herein achieve this by providing a system and method for accurate sigma-delta quantization noise minimization in an all-digital PLL, with minimum impact to area and power consumption. Referring now to the drawings, and, more particularly, to FIGS. 4 through 10, where similar reference characters denote corresponding features consistently throughout the figures, there area shown preferred embodiments.

Figure 4:
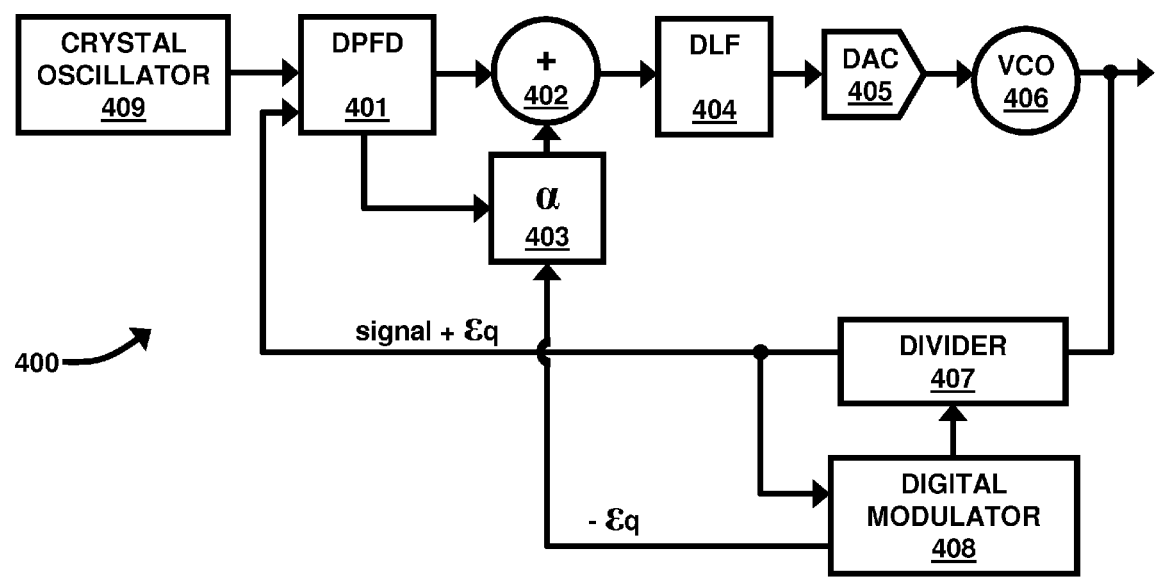
FIG. 4 is a system block diagram illustrating a low-area, low-jitter fractional-N all-digital PLL according to an embodiment herein.

FIG. 4 illustrates a block diagram of a low-jitter, low-power fractional-N all digital PLL (DPLL) 400. The digital PLL 400 includes a digital PFD (DPFD) 401, an adder 402, a digital adaptive LF (DLF) 404, a digital-to-analog converter (DAC) 405, a VCO 406, a feedback frequency divider 407, a digital sigma-delta modulator 408, a scalar multiplier 403, and a reference crystal oscillator 409.

The PLL 400 operates by comparing the crystal oscillator 409 to the feedback divider 407 frequency and phase. The output of the DPFD 401 is a digital representation of the resulting frequency and phase difference. The digital sigma-delta modulator 408 has two outputs. The quantized output goes to the input modulus control of the frequency divider 407 and the negative of the quantization error term goes into the scalar multiplier 403. The "alpha" ($\alpha$) term of the scalar multiplier 403 is controlled by the DPFD 401. The DPFD 401 measures the phase difference by a time-to-digital converter (TDC) (not shown). Like analog-to-digital converters (ADCs), the output of a TDC is prone to process and temperature variations. Attempting to compensate process and temperature directly on the TDC elements, as is conventionally done, can limit the performance of the TDC and hence increase jitter of the PLL 400. Instead, in the implementation provided by the embodiments herein, the delay through a TDC calibration cell is measured and compared against the expected output. Since the output of the TDC is a digital word, this comparison is performed in the digital domain. The multiplication factor "alpha" in the scalar multiplier 403 is scaled by the same factor as the TDC calibration block output. This is preferred since for correct quantization noise cancellation both paths of the sigma-delta quantization noise must be scaled by the same factor before subtraction is performed by the digital adder 402. Preferably, the DLF 404 is a low-pass filter, which filters out high frequency terms in the phase error signal. The output of the DLF 404 is converted into an analog signal by a digital-to-analog converter (DAC) 405, which forms the control signal for the VCO 406. The output of the VCO 406 is then fed to the frequency divider 407, which closes the loop.

Figure 5A:
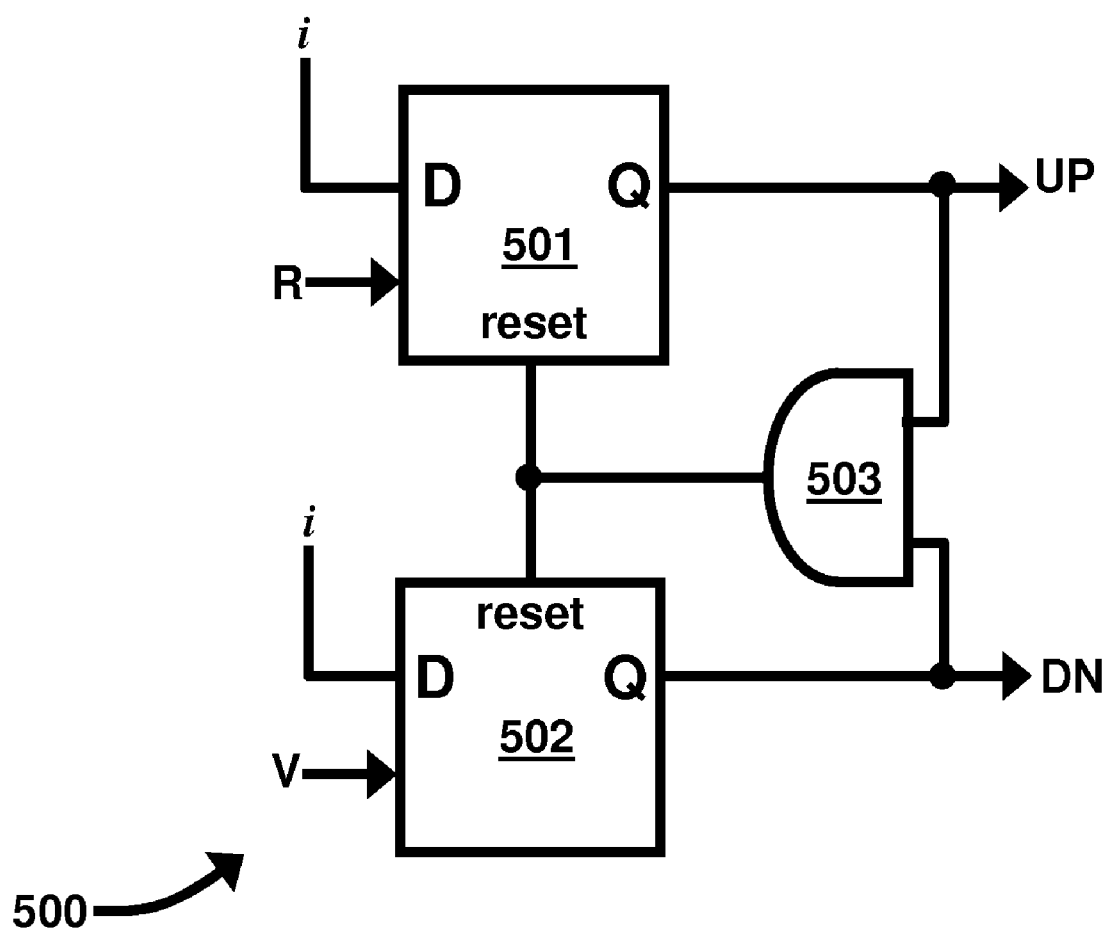
FIG. 5(A) is a system block diagram illustrating an analog phase-frequency detector.

The DPFD 401 mimics the operation of its analog counterpart. A typical analog PFD 500 and its associated output are shown in FIGS. 5(A) and 5(B), respectively. The R signal is termed the reference signal and is the output of a crystal oscillator buffer (not shown). The V signal is the output of the frequency divided down VCO signal. The scenario shown in this example is when the R signal is leading the V signal. On the rising edge of the R signal, the UP signal is asserted. Several VCO cycles later, the V signal is asserted which triggers the DN signal. Due to the feedback AND gate 503, both reference flip-flop 501 and feedback flip-flop 502 are reset, which force UP and DN to logic 0.

As indicated above, the falling edges of both UP and DN are triggered by the rising edge of the V signal, whereas the rising edge of the UP signal is triggered by the R signal. Since the PLL 400 is a time-sampled system, this would result in non-uniform sampling of the sigma-delta modulated V signal edges. When the PLL 400 is locked, the differences in the period of R and V signals are small and the effect of non-linear sampling is relatively small compared to the sigma-delta quantization noise. However, when reducing the sigma-delta quantization noise by a significant level, the effect of non-uniform sampling may be quite noticeable. Non-uniform sampling is avoided by the DPFD 401 as provided by the embodiments herein and shown in more detail in FIG. 6. The DPFD 401 comprises three main sections operatively connected to one another through circuitry embedded on an IC chip: (i) a PFD 640 adapted to generate the UP and DN signals; (ii) a fine phase error calculator block 650; and (iii) a coarse phase error calculator block 620. Referring to FIG. 5(B), the "$d_1$" term is the time difference between the first VCO edge and the R clock edge. This is computed by the TDC 654 in FIG. 6. This value is then stored in the $d_1$ register 652 (of FIG. 6). The number of VCO cycles until the next V edge is counted by the $d_1$ accumulator 622. The values in $d_1$ register 652 and $d_1$ accumulator 622 are added together by a digital adder 626 to produce the $d_1$ term. Similarly the $d_2$ accumulator 623 and $d_2$ register 653 produce the $d_2$ term. The demultiplexer (demux) 651 breaks down the data signal of the $d_1$ term prior to sending it to the $d_1$ register 652 and $d_2$ register 653. The phase error is then $d_1$-$d_2$ and is produced by the final subtractor 621. Preferably, the output is updated once every reference period.

Figure 6:
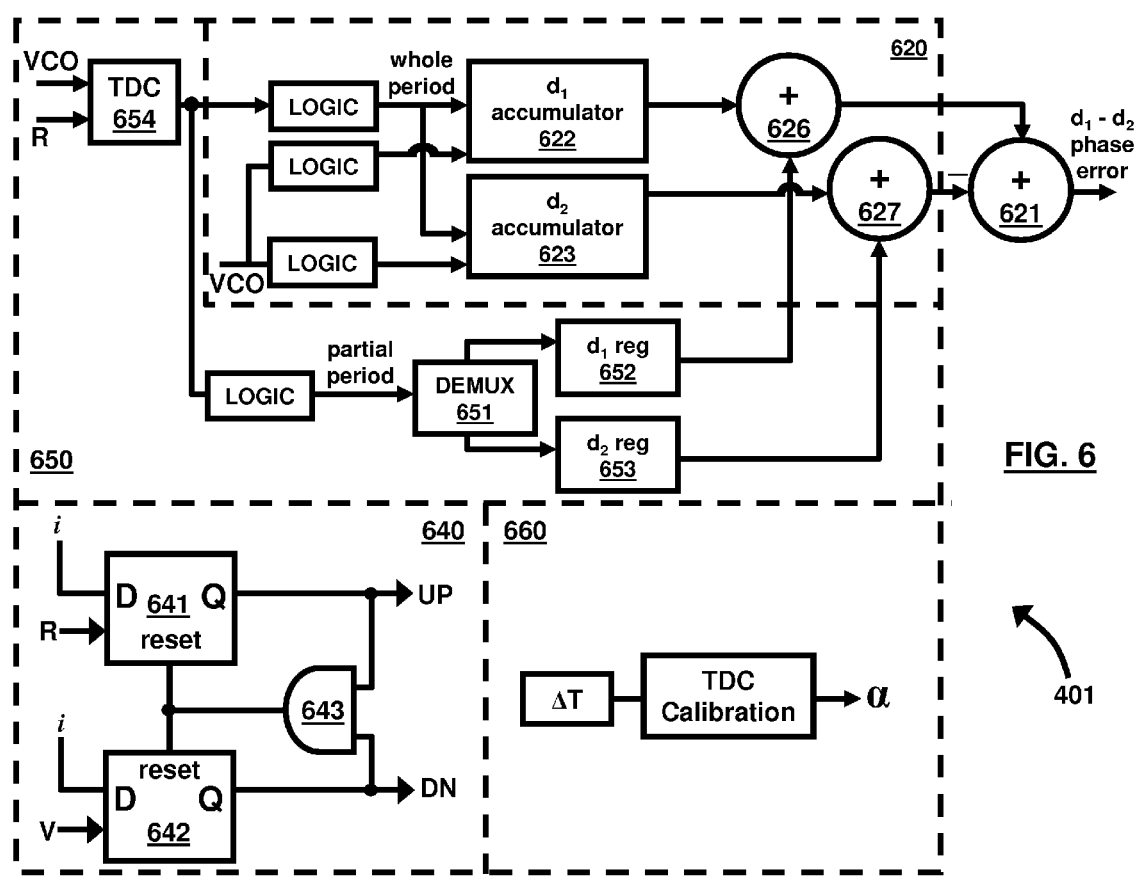
FIG. 6 is a system block diagram illustrating a DPFD according to an embodiment herein.

Another block associated with the DPFD 401, but is not functionally part of it is the TDC calibration block 660 shown in FIG. 6. This block produces the "alpha" term in FIG. 4 and is used to scale the DPFD output phase error with the quantization noise error terms by the same amount, as previously mentioned. Again, with respect to FIG. 4, the next block after the adder 402 is the DLF 404. The DLF 404 comprises an integral and linear term with weights that can be adjusted according to the required loop bandwidth. These weights are desired to be a power of two so that expensive digital multipliers can be substituted with simple bit shifts.

The preferred implementation of the DAC 405 is a current steering type of DAC 405 since the input of a ring oscillator VCO 406 is current. The DAC 405 can be partitioned into a most significant bit (MSB) section and least significant bit (LSB) section. Since in normal PLL operation, only the LSBs toggle, the MSB section can be fixed to single-ended current sources, to save static power consumption. The resolution of the MSB section is not important as long as it covers the required frequency range for the VCO 406. The LSB bits can be made current steering to reduce the effect of glitches during the periodic switching of the LSB bits.

The transition of bits from LSB to MSB in the DAC 405 is disallowed by using an "auto-range" tuning technique. It is preferable that the MSBs do not toggle during a normal mode of operation since they can introduce large glitches in the PLL output. This auto-range tuning technique detects if the steady-state code word for the output of the DLF 404 is near an MSB-LSB boundary. If so, a 0.5MSB is added or subtracted to the code word and a current source with equal magnitude, but an opposite sign is enabled in the DAC 405. Therefore, in the normal mode of operation, the steady-state code word is allowed to wander off by as much as 0.5MSB before a MSB switches.

The preferred implementation of the VCO 406 is a ring oscillator configuration which comprises three delay stages connected together in a ring configuration. The frequency of the VCO 406 is controlled by varying the input current. The VCO 406 preferably has good noise immunity from the power supply and a linear current-to-frequency transfer function over the desired output frequency range.

Figure 7A:
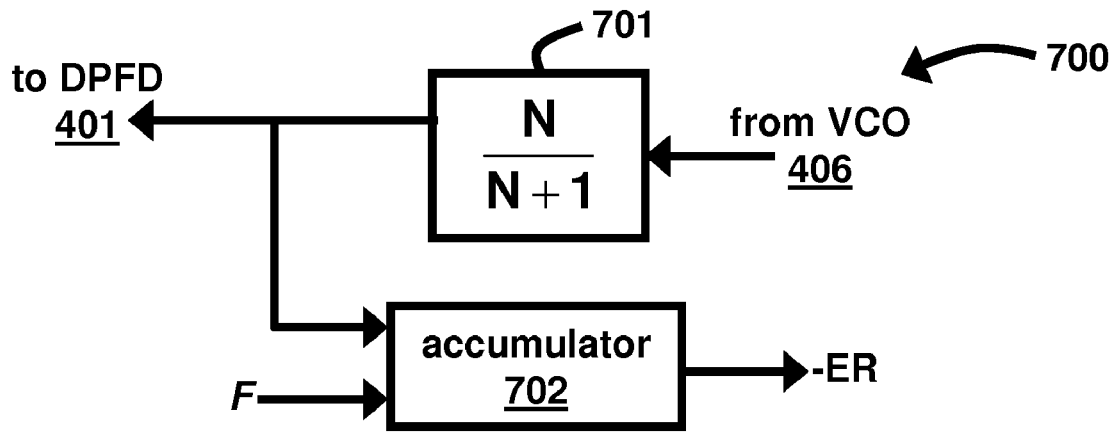
FIG. 7(A) is a system block diagram illustrating a dual-modulus divider with accumulator according to an embodiment herein.

Preferably, the divider 407 is a dual modulus divider 407 that is controlled by a digital modulator 408. This digital modulator 408 can be a simple accumulator, a second order sigma-delta modulator, a third order sigma-delta modulator, or a combination of both. In the case of a simple accumulator 702, the "carry out" signal of the accumulator 702 modulates the division ratio between N and N+1 701 as shown in FIG. 7(A). The input to the accumulator 702 is the desired fractional frequency for the DPLL 400 to produce an average output frequency of N.F. The accumulator 702 is clocked by the output of the divider 407. This configuration is referred to as a fractional-N divider 700. The output accumulated value is proportional to the phase error produced by the DPFD 401 and can be subtracted from the output of the DPFD 401 after some scaling factor "alpha" to attenuate the spurious tones generated by a fractional-N PLL. The degree of spurious tone reduction depends on how accurately the "alpha" term is generated.

Figure 7B:
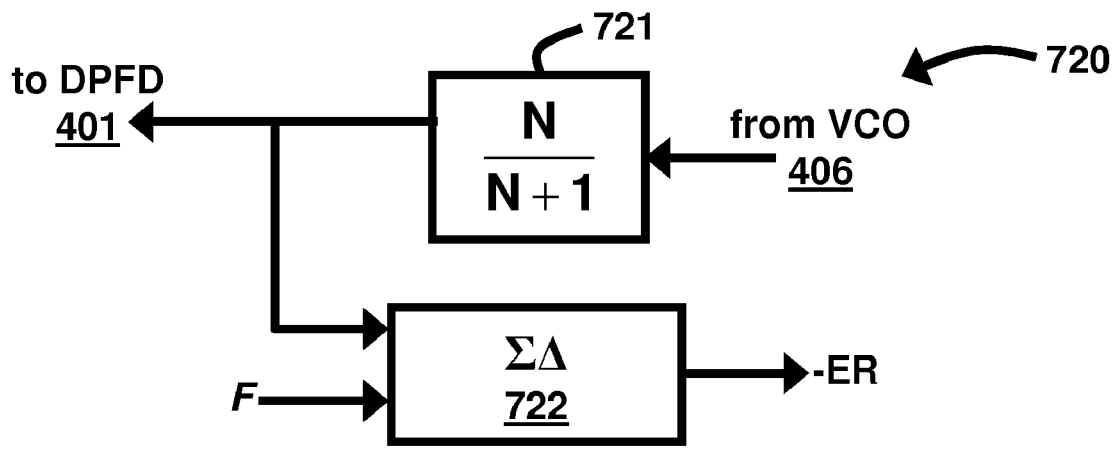
FIG. 7(B) is a system block diagram illustrating a multi-modulus divider with sigma-delta modulator according to an embodiment herein.

FIG. 7(B) illustrates a sigma-delta modulated divider 720. In principle, it works in the same way as an accumulator modulated divider 700 of FIG. 7(A). The main difference is that the choice of instantaneous division ratio is chosen in a pseudo random fashion such that quantization noise due to fixed step frequency division ratios of N and N+1 721 is modulated to a high frequency. This high-frequency noise is then attenuated by the low-pass filter response of the DPLL 400. As in the case of the accumulator modulated divider 700, the output, ER, of the sigma-delta modulated 722 is also proportional to the instantaneous phase error produced by discrete frequency division step size. The ER quantity may also be normalized by an "alpha" factor and added to the output of the DPFD 401 to subtract out the phase error introduced by the sigma-delta quantization noise.

Figure 7C:
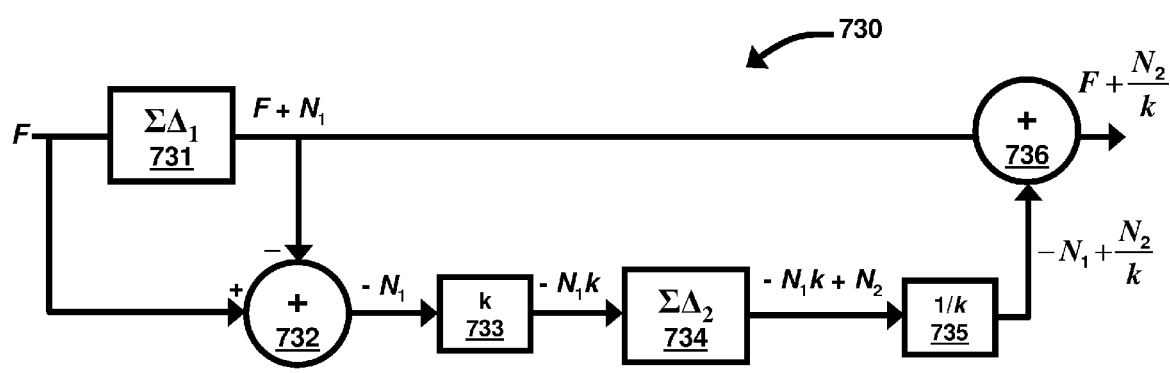
FIG. 7(C) is a system block diagram illustrating a dual sigma-delta modulator with reduced sigma-delta quantization noise according to an embodiment herein.

Another implementation of the digital modulator may be a dual sigma-delta modulator 730 as shown in FIG. 7(C). Two sigma-delta modulators 731, 734 are used in this topology. The first sigma-delta modulator, the dithering sigma-delta modulator 731, takes the input desired fractional word, F, and generates a quantized version of it F+$N_1$, where $N_1$ is the quantization noise of the dithering sigma-delta modulator 731. A subtractor 732 subtracts F+$N_1$ from F to generate a "–$N_1$" term. The "–$N_1$" is scaled up by a factor k 733 and modulated by a second sigma-delta modulator, output noise shaping sigma-delta modulator 734. The output is scaled down by a factor of k 735 and added to the output of the dithering sigma-delta modulator 731 by a digital adder 736. The output is the desired signal, F with an attenuated version of the output noise shaping sigma-delta modulator 734, $N_2$/k. An advantage of the embodiments herein is that a high order sigma-delta modulator 734 can be used to guarantee that the output of the dithering sigma-delta modulator 731 does not contain any tones.

Lower order sigma-delta modulators, such as second order sigma-delta modulators, with a constant input are plagued with undesired spurious tonal responses. Using a higher order modulator 734 helps to guarantee that the quantized value of F does not contain any tones, or cycle limits. Using a higher order sigma-delta in a PLL is problematic since the order of the loop filter has to at least match the order of the sigma-delta modulator. Higher order loop filters result in reduced phase margin and can lead to instability.

However, using the dual sigma-delta modulator 730 in FIG. 7(C) has the advantages of both high-order sigma-delta modulators 731, 734, while avoiding their disadvantages. If a third order sigma-delta modulator is used in 731 and a second order modulator is used in 734, undesired tonal response are avoided while only having only second order quantization noise to contend with.

The fractional-N all-digital PLL 400 provided by the embodiments herein is low-area, low-power, and low-jitter. Low area is achieved by eliminating a large analog-based loop filter and quantization phase error is reduced digitally. Both techniques help to achieve at least a 50% reduction in area for the same performance. Low power is achieved by eliminating extra overhead circuitry usually associated with analog PLLs, such as current for charge pumps, current generators, voltage-to-current converters, and so on. Low jitter is achieved by digitally subtracting the phase error associated with quantization noise in sigma-delta and fractional-N dividers.

Figure 8:
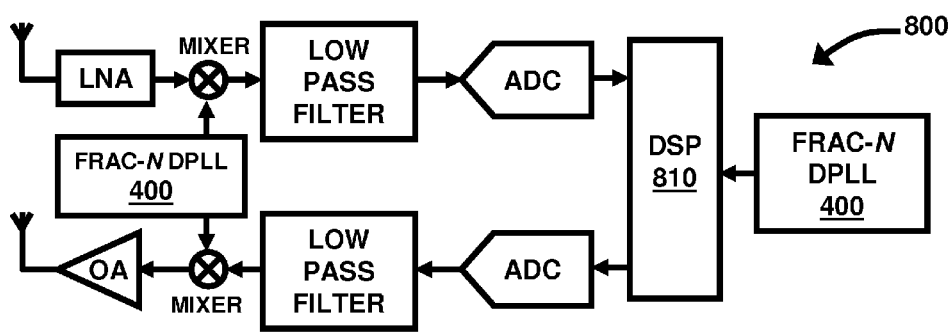
FIG. 8 is a system block diagram illustrating an exemplary use of the PLL in front-end transceiver and DSP applications according to an embodiment herein.

FIG. 8 shows an exemplary design of a wireless device 800 in which the DPLL 400 provided by the embodiments herein may be implemented. For example, FIG. 8 shows a block diagram of a wireless device 800 in a wireless communication system. Wireless device 800 may be a cellular phone, a terminal, a handset, television (TV) tuner, or some other device or design. The wireless communication system may be a Code Division Multiple Access (CDMA) system, a Global System for Mobile Communications (GSM) system, a multiple-input multiple-output (MIMO) system, an orthogonal frequency division multiplexing (OFDM) system, an orthogonal frequency division multiple access (OFDMA) system, etc. Wireless device 800 is capable of providing bi-directional communication via a receive path and a transmit path.

The wireless device 800 comprises a digital signal processor (DSP) 810 comprising various processing units such as, for example, a multiply-accumulate (MACC) unit, an arithmetic logic unit (ALU), an internal controller, a processor, a memory unit, and a bus control unit, all of which are not shown but are coupled via a bus. DSP 810 further includes a DPLL 400 that receives a reference signal (e.g., from a temperature compensated crystal oscillator (TCXO) (not shown)) and generates clock signals for the processing units within the DSP 810 and possibly processing units external to the DSP 810 (e.g., a main controller and a main memory unit). The DSP 810 may perform encoding, interleaving, modulation, channelization (e.g., with Walsh codes), spectral spread, etc., for the transmit path. Moreover, the DSP 810 may perform despreading, channelization, demodulating, deinterleaving, decoding, etc. for the receive path. The specific processing by the DSP 810 is determined by the type of communication system.

Furthermore, the DPLL 400 provided by the embodiments herein may also be implemented. For example example, the digital PLL 400 provided by the embodiments herein may be implemented in an application specific integrated circuit (ASIC), a DSP, a digital signal processing device (DSPD), a programmable logic device (PLD), a field programmable gate array (FPGA), a processor, a controller, a microcontroller, a microprocessor, and other electronic units. The digital PLL 400 may be implemented within the one or IC dies and in the one or multiple ICs. For example, all units of the digital PLL 400 may be implemented on one IC die. As another example, the DPFD 401, LF 404, and divider 407 may be implemented on one IC die, and the DAC 405 and VCO 406 may be implemented on another IC die.

The digital PLL 400 provided by the embodiments herein may also be fabricated with various IC process technologies such as complementary metal-oxide semiconductors (CMOS), n-type metal-oxide-semiconductors (NMOS), bipolar junction transistors (BJT), etc. CMOS technology can typically fabricate both n-type field effect transistor (N-FET) and p-type field effect transistor (P-FET) devices on the same die, whereas NMOS technology can generally only fabricate N-FET devices. The DPLL 400 provided by the embodiments herein may also be fabricated using different device size technologies (e.g., 0.13 mm, 90 nm, etc.).

The techniques provided by the embodiments herein may be implemented on an IC chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form including both hardware and software elements. The software embodiments include, but are not limited to, firmware, resident software, microcode, etc. For example, portions of the DPLL 400 (e.g., process 600 in FIG. 6, process 700 in FIG. 7(A), process 720 in FIG. 7(B), control of the digital PLL operation, etc.) may be implemented in software. For a software implementation, the processes and control may be implemented with modules (e.g., procedures, functions, and so on) that perform the functions described herein. The software codes may be stored in a memory unit (e.g., memory unit) and executed by a processor (e.g., processor or controller). The memory unit may be implemented within the processor or external to the processor, in which case it can be communicatively coupled to the processor via various means as is known in the art.

Accordingly, with the software implementation, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 9:
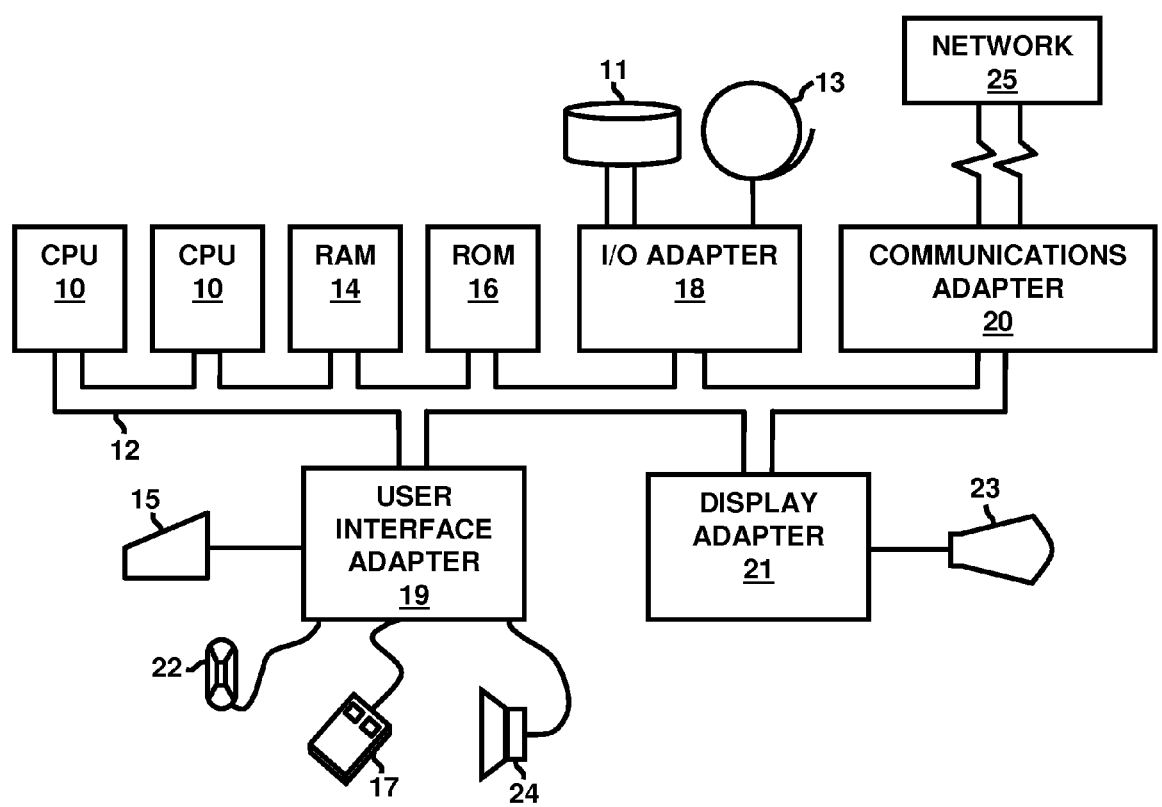
FIG. 9 is a schematic diagram illustrating a computer system according to an embodiment herein.

A representative hardware environment for practicing the embodiments herein is depicted in FIG. 9. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a RAM 14, ROM 16, and an I/O adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Figure 10:
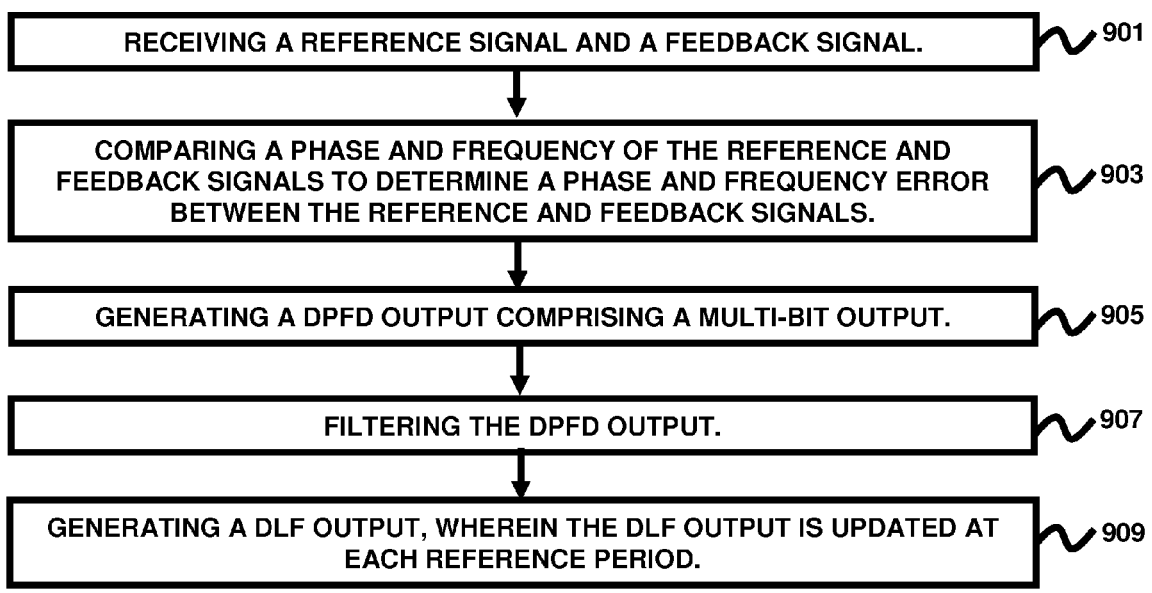
FIG. 10 is a flow diagram illustrating a preferred method according to an embodiment herein.

FIG. 10 illustrates a flow diagram illustrating a method for synthesizing frequencies with low-jitter using an all-digital fractional-N PLL electronic circuit 400 comprising a DPFD 401 and a DLF 404 according to an embodiment herein, wherein the method comprises receiving (901) a reference signal and a feedback signal; comparing (903) a phase and frequency of the reference and feedback signals to determine a phase and frequency error between the reference and feedback signals; generating (905) a DPFD output comprising a multi-bit output; filtering (907) the DPFD output; and generating (909) a DLF output, wherein the DLF output is updated at each reference period.

The method further comprises generating an oscillator signal having a frequency determined by the DLF output; dividing the oscillator signal in frequency by a factor of N, whereby N comprises any of an integer and fractional value and is one or greater; and providing the feedback signal. Additionally, the method may further comprises providing a fine phase error; and counting coarse phase errors in steps of VCO periods or multiples thereof. Also, the method may further comprise counting the coarse phase errors as a fraction of the reference period; and updating the DLF 404 every reference period.

Additionally, the method further comprises canceling out mismatches in rise and fall times associated with the coarse phase errors. Moreover, the method further comprises estimating a voltage gain of a time-to-digital converter (TDC) used to provide the fine phase error; and correcting the voltage gain by digitally scaling an output word of the TDC. Furthermore, the method may further comprise producing a quantized output to a frequency divider used to receive the oscillator signal; and producing a digital correction term to an output of the DPFD. Additionally, the method may further comprise converting the DLF output into an analog waveform.

The embodiments herein provide a new technique to realize a fractional-N all digital PLL 400. Using this technique sigma-delta quantization noise is reduced to reduce the overall jitter produced by the PLL 400. The technique afforded by the embodiments herein also has a small impact on chip area and power consumption. Since all techniques employed herein are digital, they are also robust to noise injected into the DPLL 400. Furthermore, the techniques provided by the embodiments herein may be implemented for fractional-N dividers, sigma-delta modulated dividers, and can be applied to any kind of dual modulus or multi-modulus dividers.

In general, the DPLL 400 may be designed to implement one, multiple, or all of the techniques described herein to achieve good performance. The DPLL 400 may be implemented in one or more integrated circuits and may be advantageously used for a SOC design. The DPLL 400 may also be implemented in a wireless device (e.g., a cellular phone) and other electronic devices.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for synthesizing frequencies with low-jitter using an all-digital fractional-N phase-locked loop (PLL)

electronic circuit comprising a digital phase-frequency detector (DPFD) and a digital loop filter (DLF), said method comprising:
 receiving a reference signal and a feedback signal;
 comparing a phase and frequency of the reference and feedback signals to determine a phase and frequency error between said reference and feedback signals;
 providing a fine phase error;
 counting coarse phase errors in steps of voltage controlled oscillator (VCO) periods or multiples thereof;
 generating a DPFD output comprising a multi-bit output;
 filtering said DPFD output; and
 generating a DLF output, wherein said DLF output is updated at each reference period.

2. The method of claim 1, further comprising:
 generating an oscillator signal having a frequency determined by said DLF output;
 dividing said oscillator signal in frequency by a factor of N, whereby N comprises any of an integer and fractional value and is one or greater; and
 providing said feedback signal.

3. The method of claim 1, further comprising:
 counting said coarse phase errors as a fraction of said reference period; and
 updating said DLF every reference period.

4. The method of claim 1, further comprising canceling out mismatches in rise and fall times associated with said coarse phase errors.

5. The method of claim 1, further comprising:
 estimating a voltage gain of a time-to-digital converter (TDC) used to provide said fine phase error; and
 correcting said voltage gain by digitally scaling an output word of said TDC.

6. The method of claim 2, further comprising:
 producing a quantized output to a frequency divider used to receive said oscillator signal; and
 producing a digital correction term to an output of said DPFD.

7. The method of claim 1, further comprising converting said DLF output into an analog waveform.

8. An all-digital fractional-N phase-locked loop (PLL) electronic circuit adapted to synthesize frequencies with low-jitter, said electronic circuit comprising a digital phase-frequency detector (DPFD) operatively connected to a digital loop filter (DLF); a time-to-digital converter (TDC) adapted to provide fine phase error; dual registers adapted to hold fine phase error terms; and a set of accumulators adapted to count coarse phase errors in steps of VCO periods or multiples thereof,
 wherein said DPFD is adapted to;
  receive a reference signal and a feedback signal;
  compare a phase and frequency of the reference and feedback signals to determine a phase and frequency error between said reference and feedback signals; and
  provide a DPFD output comprising a multi-bit output;
 wherein said DLF is adapted to receive and filter said DPFD output and provide a DLF output, and
 wherein said DLF output is updated at each reference period.

9. The electronic circuit of claim 8, further comprising a software module operatively connected to said set of accumulators and adapted to count said coarse phase errors as a fraction of said reference period and update said DLF every reference period.

10. The electronic circuit of claim 8, wherein said TDC comprises a set of two delay chains adapted to cancel out mismatches in rise and fall times in each delay chain.

11. The electronic circuit of claim 8, further comprising a calibration block operatively connected to said DPFD and adapted to estimate a voltage gain of said TDC and correct said voltage gain by digitally scaling an output word of said TDC.

12. An all-digital fractional-N phase-locked loop (PLL) electronic circuit adapted to synthesize frequencies with low-jitter, said electronic circuit comprising:
 a digital phase-frequency detector (DPFD) adapted to receive a reference signal and a feedback signal, compare a phase and frequency of the reference and feedback signals to determine a phase and frequency error between said reference and feedback signals, and provide a DPFD output comprising a multi-bit output;
 a digital loop filter (DLF) operatively connected to said DPFD, wherein said DLF is adapted to receive and filter said DPFD output and provide a DLF output, and wherein said DLF output is updated at each reference period;
 a voltage controlled oscillator (VCO) adapted to receive said DLF output and provide an oscillator signal having a frequency determined by said DLF output;
 a frequency divider adapted to receive said oscillator signal, divide said oscillator signal in frequency by a factor of N, whereby N comprises any of an integer and fractional value and is one or greater, and provide said feedback signal; and
 a digital modulator adapted to produce a quantized output to said frequency divider and a digital correction term to an output of said DPFD.

13. The electronic circuit of claim 12, wherein said digital modulator comprises any of an accumulator, an mth order sigma-delta modulator for any integer m greater than one, and a network of sigma-delta modulators.

14. The electronic circuit of claim 12, wherein said digital modulator comprises a first sigma-delta modulator and a second sigma-delta modulator arranged to cancel out a quantization noise of said first sigma-delta modulator while scaling down a quantization noise of said second sigma-delta modulator.

15. The electronic circuit of claim 14, wherein an output of said digital modulator comprises said feedback signal plus the scaled down quantization noise of said second sigma-delta modulator.

16. An all-digital fractional-N phase-locked loop (PLL) electronic circuit adapted to synthesize frequencies with low-jitter, said electronic circuit comprising:
 a digital phase-frequency detector (DPFD) adapted to:
  receive a reference signal and a feedback signal;
  compare a phase and frequency of the reference and feedback signals to determine a phase and frequency error between said reference and feedback signals; and
  provide a DPFD output comprising a multi-bit output;
 a digital loop filter (DLF) operatively connected to said DPFD and adapted to receive and filter said DPFD output and provide a DLF output, wherein said DLF output is updated at each reference period;
 a digital-to-analog converter (DAC) operatively connected to said DLF and adapted to receive and convert said DLF output to an analog waveform, wherein said analog waveform comprises any of an analog voltage waveform and an analog current waveform, wherein said DAC comprises A most significant bits (MSBs) of data and B least significant bits (LSBs) of data, and wherein said DAC is adapted to provide an A+B bit conversion to said analog waveform; and means for offsetting elements being toggled in an A+B bit DAC by factoring a B-bit word by two and enabling a half-MSB-sized element with an opposite polarity.

17. The electronic circuit of claim 16, wherein said A MSBs comprise bipolar outputs comprising any of on and off outputs, and wherein said B LSBs are current-switched.

18. The electronic circuit of claim 17, wherein said B LSBs are current-switched by adding any of voltage to a total output analog voltage signal and current to a total output analog current signal.

19. The electronic circuit of claim 17, wherein said B LSBs are current-switched by adding voltage to a supply rail voltage.

* * * * *